United States Patent [19]

Kressman

[11] Patent Number: 5,311,657
[45] Date of Patent: May 17, 1994

[54] MOTHERBOARD TOOL

[76] Inventor: Joel L. Kressman, 735 Urban St., Sulphur, La. 70663

[21] Appl. No.: 999,273

[22] Filed: Dec. 31, 1992

[51] Int. Cl.[5] .................. H01R 43/00; H05K 3/30
[52] U.S. Cl. ............................. 29/721; 29/758; 29/764
[58] Field of Search ............ 29/764, 762, 758, 741, 29/426.5, 720, 721

[56] References Cited

U.S. PATENT DOCUMENTS 3,087,235 4/1963 Porter ............................ 29/764
3,210,832 10/1965 Kalen ........................... 29/764 X
4,800,647 1/1989 Guyev ........................... 29/764 X Primary Examiner—Carl E. Hall
Attorney, Agent, or Firm—E. Michael Combs

[57] ABSTRACT

A tool structure includes an outer housing formed of upper and lower tube structure coaxially mounting a punch member therebetween, with the punch member having a collar and a spring interposed between the collar and an abutment flange of a lower portion of the housing. In this manner, the punch member includes a punch head having a receiving socket to position the tool structure overlying a component of a motherboard for permitting projection of the component relative to the motherboard minimizing damage to the component.

2 Claims, 4 Drawing Sheets

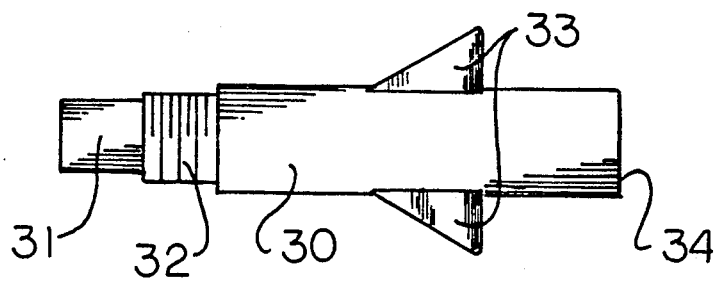
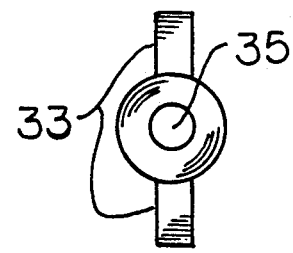
FIG 8  FIG 9
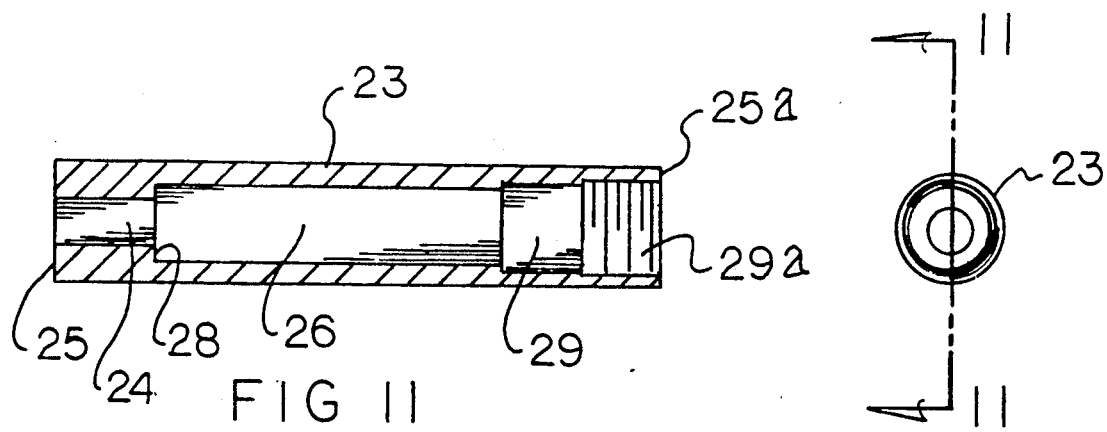
FIG 11  FIG 10

MOTHERBOARD TOOL

BACKGROUND OF THE INVENTION

1. Field of the Invention

The field of invention relates to tool structure, and more particularly pertains to a new and improved motherboard tool permitting the projection and removal of a stand-off member relative to a motherboard.

2. Description of the Prior Art

Tool structures of various types have been utilized throughout the prior art for accommodating manipulation of various components such as exemplified in the U.S. Pat. Nos. 4,372,186 and 3,994,320 indicating the use of prior art tool structure relative to tool wrapping relative to an electrical motherboard type member.

The instant invention attempts to address a specialized need for the projection of a component relative to a motherboard permitting registration and alignment of the tool structure in a coaxially aligned relationship relative to the component permitting its ejection from an associated motherboard plate.

SUMMARY OF THE INVENTION

In view of the foregoing disadvantages inherent in the known types of tool apparatus now present in the prior art, the present invention provides a motherboard tool wherein the same is arranged for the positioning of the tool structure relative to a stand-off member relative to a motherboard and the force coaxially aligned relative to the structural component for its removal relative to the motherboard. As such, the general purpose of the present invention, which will be described subsequently in greater detail, is to provide a new and improved motherboard tool which has all the advantages of the prior art tool apparatus and none of the disadvantages.

To attain this, the present invention provides a tool structure including an outer housing formed of upper and lower tube structure coaxially mounting a punch member therebetween, with the punch member having a collar and a spring interposed between the collar and an abutment flange of a lower portion of the housing. In this manner, the punch member includes a punch head having a receiving socket to position the tool structure overlying a component of a motherboard for permitting projection of the component relative to the motherboard minimizing damage to the component.

It is therefore an object of the present invention to provide a new and improved motherboard tool which has all the advantages of the prior art tool apparatus and none of the disadvantages.

It is another object of the present invention to provide a new and improved motherboard tool which may be easily and efficiently manufactured and marketed.

It is a further object of the present invention to provide a new and improved motherboard tool which is of a durable and reliable construction.

An even further object of the present invention is to provide a new and improved motherboard tool which is susceptible of a low cost of manufacture with regard to both materials and labor, and which accordingly is then susceptible of low prices of sale to the consuming public, thereby making such motherboard tools economically available to the buying public.

Still yet another object of the present invention is to provide a new and improved motherboard tool which provides in the apparatuses and methods of the prior art some of the advantages thereof, while simultaneously overcoming some of the disadvantages normally associated therewith.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 8 is an orthographic view of the upper tube structure of the housing of the invention.

FIG. 9 is an orthographic bottom view of the lower tube structure.

FIG. 10 is an orthographic top view of the lower tube structure.

FIG. 11 is an orthographic view, taken along the lines 11—11 of FIG. 10 in the direction indicated by the arrows.

DESCRIPTION OF THE PREFERRED EMBODIMENT

Figure 1:
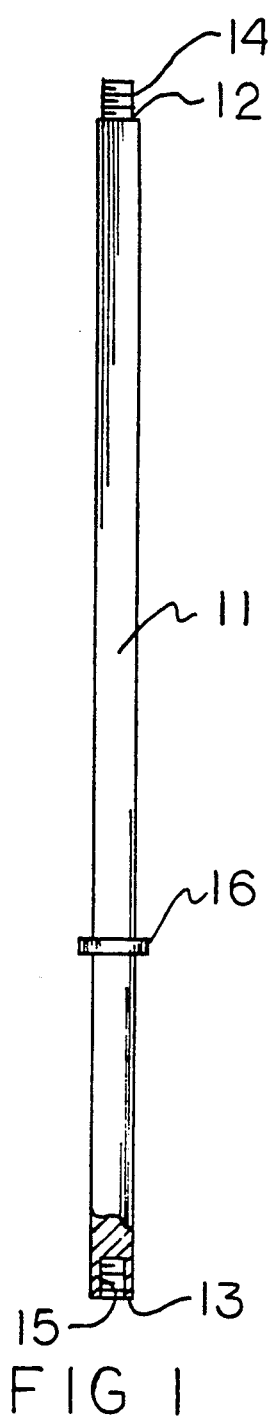
FIG. 1 is an orthographic view, partially in section, of the punch member of the invention.
Figure 2:
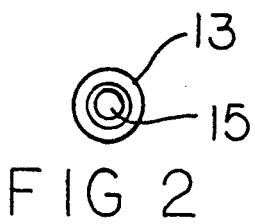
FIG. 2 is an orthographic bottom view of the tool structure, as set forth in FIG. 1.
Figure 3:
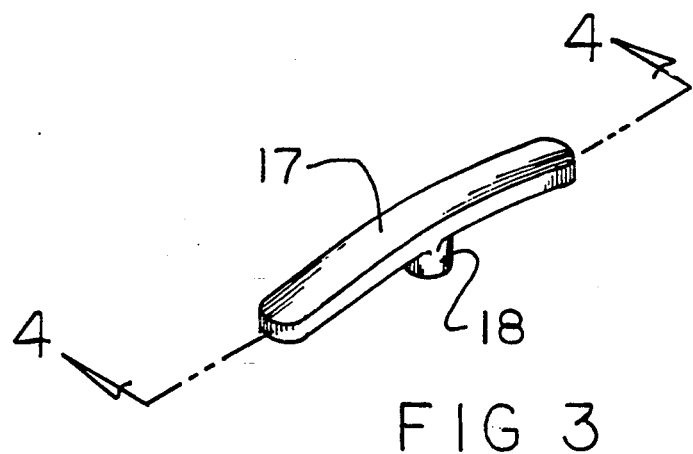
FIG. 3 is an isometric illustration of the handle structure of the invention.
Figure 4:
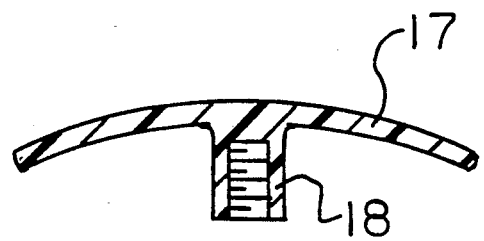
FIG. 4 is an orthographic view, taken along the lines 4—4 of FIG. 3 in the direction indicated by the arrows.
Figure 5:
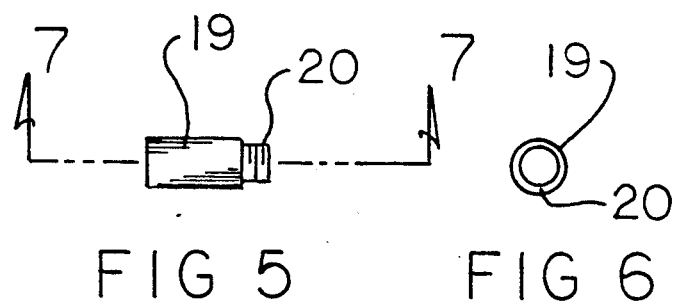
FIG. 5 is an orthographic side view of the punch head of the invention.
Figure 6:
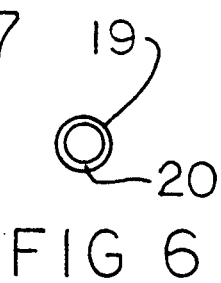
FIG. 6 is an orthographic top view of the punch head, as set forth in FIG. 5.
Figure 7:
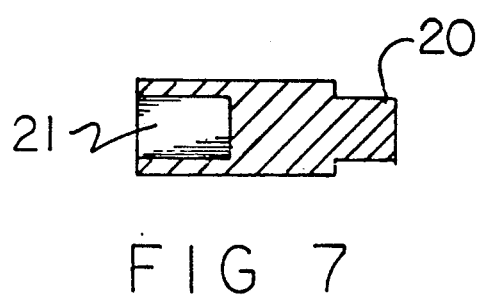
FIG. 7 is an orthographic view, taken along the lines 7—7 of FIG. 5 in the direction indicated by the arrows.

With reference now to the drawings, and in particular to FIGS. 1 to 15 thereof, a new and improved motherboard tool embodying the principles and concepts of the present invention and generally designated by the reference numeral 10 will be described.

Figures 12, 13:
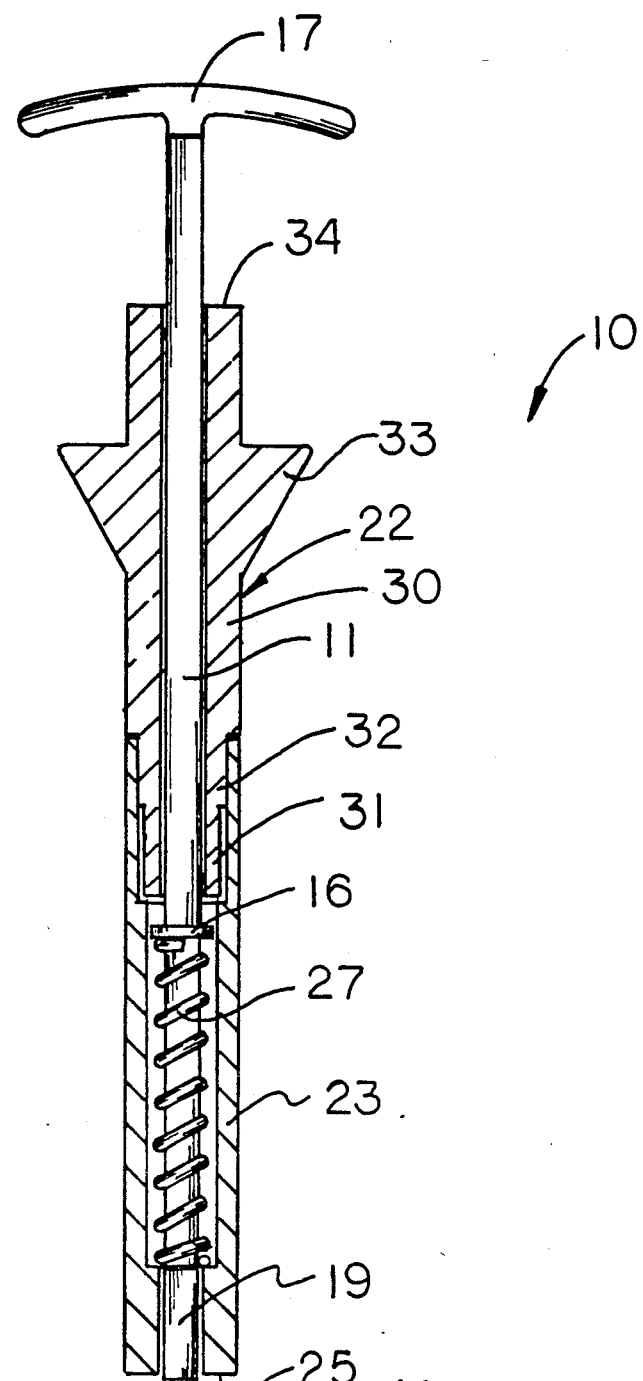
FIG. 12 is an orthographic top view of the assembled invention.
FIG. 13 is an orthographic cross-sectional illustration of the invention.
Figure 15:
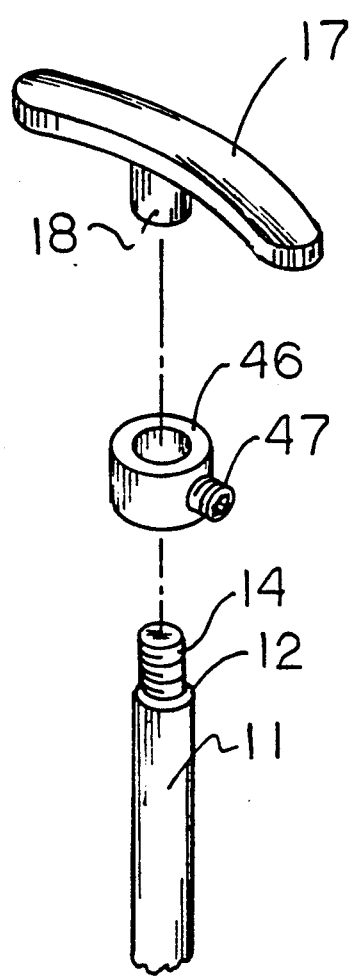
FIG. 15 is an isometric illustration in the use of a depth control collar mounted to the punch of the invention.

More specifically, the motherboard tool 10 of the instant invention essentially comprises an elongate cylindrical punch 11, having a punch first end 12 spaced from a punch second end 13, with the punch 11 coaxially aligned. A first end externally threaded boss 14 is integrally mounted to the first end, with the second end having a second end socket 15 directed therein. The second end socket is internally threaded as indicated. A fixed collar 16 is fixedly mounted to the punch 11 spaced between the first and second ends to provide for an abutment of a return spring 27 interposed between the collar 16 and the second end 13. An arcuate handle 17 is provided of an arcuate construction to accommodate an individual's palm positioned upon the handle, with the arcuate handle having an internally threaded socket 18 fixedly mounted medially of the concave surface of the handle to threadedly receive the threaded boss 14 therewithin. A punch head 19 is provided having an internally threaded boss 20 threadedly received within the second end socket 15, with the punch head having a punch head socket 21 arranged for receiving and aligning a stand-off member "S", such as indicated in FIG. 13, relative to a motherboard "M". The cylindrical punch 11 is arranged in several components, as indicated in the FIGS. 1-7, for its mounting within a guide housing 12 that is also provided in disassembled form, as a lower tube 23 mounted to an upper tube 30. The guide housing lower tube 23 includes a lower tube first bore 24 directed into the lower tube from a lower tube first end 25, with the lower tube having a lower tube second end 25a at an opposed end of the lower tube 23. A lower tube second bore 26 is in communication with the first bore 24, wherein the first bore is of a first diameter, the second bore of a second diameter greater than the first diameter to provide for an annular flange 28 at an interface of the first bore and the second bore to accommodate a lower end portion of the return spring 27 interposed between the annular flange 28 and the fixed collar 26, as indicated in FIG. 13, to provide for retraction of the punch 11 within the guide housing 22. A third bore 29 in communication with the second bore 26 is of a third diameter greater than the second diameter to receive a housing upper end tube, and more specifically the housing upper end tube pilot shaft 31 received within the third bore 29. The third bore is further formed with an internally threaded portion extending to the lower tube second end 25a to receive the upper tube externally threaded surface 32 therewithin to secure the lower tube 23 relative to the upper tube 30 in a coaxially aligned relationship. Wing plates 33 are fixedly mounted to an exterior surface of the upper tube 30 for assisting in manual grasping of the housing structure. The upper tube second end 34 is provided with an upper tube bore 35 arranged coextensive of the upper tube second end 34 and the upper tube first end, with the upper tube bore 35 coaxially aligned with the first, second, and third bores of the lower housing to slidably receive the punch 11 therethrough, with the punch and the housing coaxially aligned about a housing axis 41 (see FIG. 14).

Figure 14:
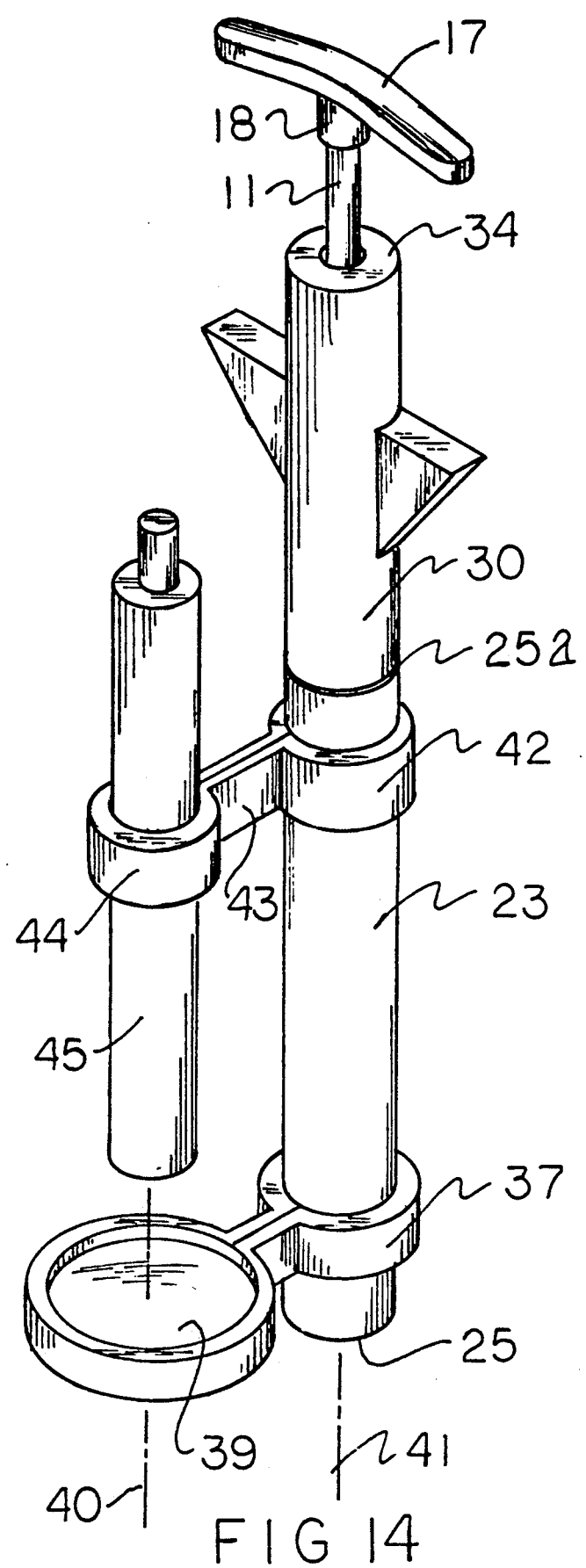
FIG. 14 is an isometric illustration of a modified aspect of the invention.

The FIG. 14 is a modified aspect of the invention, having a first collar 37 fixedly secured to a magnification lens 39 by means of a first collar link 38. The magnification lens 39 is symmetrically oriented about a lens axis 40 parallel to the housing axis 41. A second collar 42 mounted in a spaced relationship relative to the first collar in adjacency to the lower housing second end has a second collar link 43 fixedly mounting the second collar to a third collar 44 that is coaxially aligned with a lens axis 40 mounting fixedly a flashlight member 45 coaxially relative to the lens axis 40 for enhanced illumination. The FIG. 15 indicates the use of a fourth collar 46 arranged for securement about the punch 11 in adjacency to the punch first end 12, with a fourth collar fastener 47 directed through the fourth collar for fastening to the punch 11 to control depth projection of the punch relative to the guide housing 22.

The first and second housings are configured in the separable configuration to permit the insertion of the punch member into the second housing through the second housing's first end through the upper tube bore 35 permitting subsequent mounting of the handle 17 to the punch. The spring 27 is then interposed onto and about the punch, then permitting mounting of the lower tube 23 in fastened securement to the upper tube 30, with subsequent mounting of the punch head 19 onto the punch's second end 13.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationship for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A motherboard tool, comprising,
an elongate cylindrical punch, the punch having a punch first end spaced from a punch second end, the punch first end including a first end boss, the punch second end having a second end socket, and
a collar fixedly mounted to the punch between the punch first end and the punch second end, and
a punch head having a punch head boss, the punch head boss arranged for securement within the second end socket, and the punch head further including a punch head socket coaxially aligned with the punch head boss and with the punch, and
the punch including a handle, with the handle having a handle boss, the handle boss arranged for fixedly receiving the first end boss, and
a guide housing, with the punch mounted slidably through the guide housing permitting positioning of the guide housing onto a workpiece to effect projection of the workpiece by projecting the punch relative to the guide housing, and
the guide housing including a guide housing lower tube, and a guide housing upper tube arranged for securement relative to one another, with the guide housing lower tube having a lower tube first end and a lower tube second end, the lower tube includes a first bore directed into the lower tube from the lower tube first end, with the first bore having a first diameter, and a second bore in communication with the first bore within the lower tube, with the second bore having a second diameter greater than the first diameter, and a third bore directed from the second bore to the lower tube second end, and an annular flange at an interface between the first bore and the second bore, with a return spring, the return spring captured between the annular flange and the fixed collar to bias the punch within the housing in a retracted orientation, and the third bore including a third bore internally threaded portion, and the upper tube having an upper tube pilot shaft received within the third bore, and an upper tube externally threaded surface threadedly received within the third bore internally threaded portion, and the upper housing having a through-extending upper tube bore, and the guide housing and the punch symmetrically oriented about a housing axis, and the upper housing having upper tube wing plates fixedly mounted to the upper tube projecting exteriorly of the upper tube for cooperation with a handle for manually securing the housing relative to the punch when projecting the punch through the housing, and a first collar fixedly mounted to the lower tube in adjacency to the lower tube first end, and the first collar having a first collar link and a magnification lens, the magnification lens symmetrically oriented about a lens axis parallel to the housing axis, and a second collar fixedly mounted to the lower tube in adjacency to the lower tube second end, and the second collar having a second collar link, and a third collar fixedly mounted to the second collar link, with the third collar coaxially aligned with the lens axis, and a flashlight member fixedly mounted within the third collar coaxially aligned with the lens axis to project illumination through the magnification lens.

2. A motherboard tool as set forth in claim 1 including a fourth collar, the fourth collar having a fourth collar fastener, with the fourth collar arranged for mounting about the punch between the punch first end and the handle, with the fourth collar fastener arranged for engaging the punch for fixedly securing selectively the fourth collar about the punch.

* * * * *